(12) United States Patent
Yamauchi

(10) Patent No.: US 10,628,302 B2
(45) Date of Patent: Apr. 21, 2020

(54) SEMICONDUCTOR STORAGE DEVICE

(71) Applicant: Winbond Electronics Corp., Taichung (TW)

(72) Inventor: Kazuki Yamauchi, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/180,013

(22) Filed: Nov. 5, 2018

(65) Prior Publication Data
US 2019/0213121 A1    Jul. 11, 2019

(30) Foreign Application Priority Data
Jan. 9, 2018   (JP) ................. 2018-001164

(51) Int. Cl.
*G11C 16/04*    (2006.01)
*G06F 12/02*    (2006.01)
(Continued)

(52) U.S. Cl.
CPC ...... *G06F 12/0246* (2013.01); *G06F 13/4282* (2013.01); *G11C 5/02* (2013.01); *G11C 5/04* (2013.01); *G11C 7/24* (2013.01); *G11C 8/12* (2013.01); *G11C 16/10* (2013.01); *G11C 16/107* (2013.01); *G11C 16/22* (2013.01); *G11C 16/32* (2013.01); *G11C 29/00* (2013.01); *G11C 29/52* (2013.01); *G11C 29/028* (2013.01); *G11C 2029/0409* (2013.01); *G11C 2029/4402* (2013.01); *H01L 25/0657* (2013.01); *H01L 2224/32145* (2013.01); *H01L 2225/0651* (2013.01); *H01L 2225/06513* (2013.01); *H01L 2225/06517* (2013.01); *H01L 2924/1434* (2013.01); *H01L 2924/1436* (2013.01);
(Continued)

(58) Field of Classification Search
CPC ..... G11C 5/02; G11C 16/107; G06F 12/0246; G06F 13/4282
See application file for complete search history.

(56) References Cited

U.S. PATENT DOCUMENTS 7,319,617 B2 * 1/2008 Park ............... G11C 16/3418
                                                 365/185.02
9,063,849 B2 * 6/2015 Lee ................ G06F 12/0246
(Continued)

FOREIGN PATENT DOCUMENTS

CN    103608867    3/2016
JP    2008300469   12/2008
(Continued)

*Primary Examiner* — Pho M Luu
(74) *Attorney, Agent, or Firm* — JCIPRNET

(57) ABSTRACT

A semiconductor memory device preventing inconsistent busy states between a plurality of memory chips is provided. A semiconductor memory device includes a master chip and at least one slave chip. The master chip and the slave chip include a status register capable of storing protection information. When a write-protect (WP) commend for locking the protection information of the status register is input, the protection information and lock information are programmed in a memory array. At this time, programming is controlled in a manner that a programming time in a selected memory chip is longer than a programming time in an unselected memory chip.

18 Claims, 4 Drawing Sheets

(51) Int. Cl.
  *G11C 16/10*  (2006.01)
  *G06F 13/42*  (2006.01)
  *G11C 5/02*   (2006.01)
  *G11C 29/52*  (2006.01)
  *G11C 5/04*   (2006.01)
  *G11C 8/12*   (2006.01)
  *G11C 7/24*   (2006.01)
  *G11C 29/00*  (2006.01)
  *G11C 16/22*  (2006.01)
  *G11C 16/32*  (2006.01)
  *H01L 25/065* (2006.01)
  *G11C 29/04*  (2006.01)
  *G11C 29/02*  (2006.01)
  *G11C 29/44*  (2006.01)

(52) U.S. Cl.
  CPC ............... *H01L 2924/1438* (2013.01); *H01L 2924/15311* (2013.01)

(56) References Cited

U.S. PATENT DOCUMENTS

| | | | |
|---|---|---|---|
| 9,324,457 B2 * | 4/2016 | Takizawa | ............... G11C 11/161 |
| 9,524,250 B2 | 12/2016 | Pekny | |
| 2018/0059970 A1 * | 3/2018 | Takazawa | ............. G06F 3/0619 |

FOREIGN PATENT DOCUMENTS

| | | |
|---|---|---|
| JP | 2014057077 | 3/2014 |
| TW | I534829 | 5/2016 |

* cited by examiner

SEMICONDUCTOR STORAGE DEVICE

CROSS REFERENCE TO RELATED APPLICATION

This application claims the priority benefit of Japan application serial no. 2018-001164, filed on Jan. 9, 2018. The entirety of the above-mentioned patent application is hereby incorporated by reference herein and made a part of specification.

BACKGROUND

Technical Field

The disclosure relates to a semiconductor storage device in which a plurality of dies or chips are stacked and more particularly to a flash memory equipped with a serial peripheral interface (SPI) function.

Description of Related Art

In a multichip package technique, a plurality of dies or chips of the same type or different types are stacked in one package. For example, the storage capacity may be expanded by stacking memory chips of the same type, or different storage functions may be provided by stacking memory chips of different types. For example, in the non-volatile semiconductor storage device disclosed in Japanese Publication No. 2008-300469, a plurality of memory array chips and control chips for controlling the memory array chips are stacked, and a through electrode of the memory array chips and a through electrode of the control chips are aligned for electrically connecting the two through electrodes. In addition, in the semiconductor device disclosed in Japanese Publication No. 2014-57077, a master flash memory chip and a slave flash memory chip are laminated with a non-core circuit being omitted from the slave flash memory chip, and a signal and a voltage required by operations of device are provided from the master flash memory chip to the flash memory chip.

In a memory device in which a plurality of memory chips are stacked, each memory chip monitors an address output from a host computer and detects whether it is a selected memory chip. The host computer does not need to use a specific command for selecting the memory chip, but outputs a command or an address to a memory device in the same way as processing a monolithic memory chip (hereinafter, the memory device is referred to as a monolithic stacked die).

Additionally, one of the stacked memory chips may be set as a master chip, another one may be set as a slave chip, and the master chip or the slave chip is identified. The master/slave setting may be performed, for example, by a fuse or a metal option. For example, an identification (ID) of the master chip is set to "00", an ID of the slave chip is set to "01", the master chip may be selected when BA10=L (i.e., a block address of "10" is L), and the slave chip may be selected when BA10=H.

In this monolithic stacked flash memory, a situation that a period in which the master chip is busy is inconsistent with a period in which the slave chip is busy may occur. For example, problems may include as follows. Although the master chip is not in the busy state, the slave chip is in the busy state, an action instructed by the host computer cannot be performed in the slave chip even if the slave chip is selected according to the address from the host computer.

For example, an NAND flash memory equipped with an SPI function has a status register (SR), the SR stores protection information related to the action or specification of the flash memory or information related to whether the flash memory is in the busy state or the like. The SR may be accessed by a read command or a write command, and the user may write protection information, such as, information related to available areas in the memory array, information related to whether an error correction code is used and information related to protected blocks and so on, in to SR. In a flash memory such as SPI-NAND which does not have a busy/ready pin, the user may be aware of whether the flash memory is in the busy state by reading the SR.

The flash memory is equipped with a function to lock information to be written in the SR or information written into the memory array and with respect to a one-time programming area which fails to be accessed by the user. The one-time programming area is, for example, an area that can store information, such as important parameters related to the operation or specification of the flash memory.

In a condition that the information stored in the SR or the one-time programming area is locked (writing inhibited), a write protect (WP) command is issued from the host computer to the flash memory. The flash memory, if receiving the WP command, sets a specific flag bit (flag bit) assigned to the SR or a fuse register in the one-time programming area to, for example, "1" and thereafter, inhibits the access of the write command configured to rewrite the data in the SR or the one-time programming area. In addition, when executing the WP command, the flash memory programs the lock information set in the fuse register or the protection information program written in the SR to a redundant area in the memory array. Since the fuse register or the SR is volatile, it is necessary to permanently store the lock information or the protection information in a non-volatile redundant area. When the flash memory is again powered on, the protection information or the lock information read from the redundant area is loaded into the SR or the fuse register.

When the read command of the SR is issued from the host computer, the contents of the SR are read from the selected memory chip. In a condition that a monolithic stacked die, since the selection of the memory chip is determined by the address, the SR of each of the master chip and the slave chip must be always the same. Therefore, in the monolithic stacked die, in a condition that the write command is issued from the host computer, the master chip and the slave chip simultaneously execute the write command, and the SR/the one-time programming area is rewritten. In addition, in a condition that the WP command is issued, the master chip and the slave chip also simultaneously execute the WP command, and the fuse register is set to "1" for locking the SR or the one-time programming area.

However, in the operation of such monolithic stacked die, there are issues as follows.

(1) Normally, it is feasible to monitor the busy state of the selected memory chip according to the read command of the SR, but the user is unable to monitor a state of an unselected memory chip. Therefore, a locking operation on the unselected memory chip (including a programming operation on the redundant area) must end earlier than the locking operation on the selected memory chip. Otherwise, even though the unselected memory chip is still busy, the user may obtain the ready state output from the selected memory chip by reading the command. (2) If two memory chips simultaneously execute the WP command, the memory array is simultaneously programmed, such that an operating current (Icc) becomes doubled.

SUMMARY

The disclosure is directed to a semiconductor storage device preventing inconsistent busy states between a plurality of memory chips. The disclosure is further directed to a semiconductor storage device capable of suppressing a peak in current consumption.

A semiconductor storage device of the disclosure includes a plurality of memory chips, and selects one of a plurality of memory chips based on an address provided from the external. Each of the memory chips includes a status register (SR) capable of storing protection Information, a non-volatile memory array, a write portion performing a writing operation on the SR in response to a command from the external, a read portion performing a reading operation on the SR in response to a command from the external, a write inhibit portion inhibiting the writing operation on the SR in response to a command from the external and programming the protection information and write inhibit information in a specific area of the memory array and a control portion controlling operations of the memory chip. The control portion of the selected memory chip controls the programming in a manner that a programming time of the write inhibit portion is longer than a programming time of the write inhibit portion of an unselected memory chip.

In an embodiment, the control portion of the unselected memory chip controls the programming in a manner that the programming time of the write inhibit portion is shorter than the programming time of the write inhibit portion of the selected memory chip. In an embodiment, the programming is controlled in a manner that a programming pulse number of the selected memory chip is greater than a programming pulse number of the unselected memory chip. In an embodiment, the unselected memory chip is programmed after the selected memory chip is programmed, and during the programming of the unselected memory chip, a waiting time is controlled in a manner that a busy state continues in the selected memory chip. In an embodiment, the selected memory chip is programmed after the unselected memory chip is programmed, and during the programming of the unselected memory chip, the selected memory chip is controlled in a manner that waiting for the start of the programming. In an embodiment, the read portion of the selected memory chip outputs a busy state contained in contents of the SR. In an embodiment, the control portion determines whether the memory chip itself is the selected memory chip based on the address from the external, and the selected memory chip performs an operation in response to the command from the external. In an embodiment, the control portion determines whether the command from the external is a command associated with the SR, and when it is a command associated with the SR, the selected memory chip and the unselected memory chip perform operations in response to the command associated with the SR. In an embodiment, the plurality of memory chips are flash memories. In an embodiment, the plurality of memory chips are provided with a serial interface function capable of inputting and outputting data in synchronization with a clock signal provided from the external.

According to the disclosure, since the programming time in the selected memory chip is longer than the programming time in the unselected memory chip, the phenomenon that the unselected memory chip is in the busy state, but the selected memory chip is not can be prevented.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Hereinafter, the embodiments of the disclosure will be described in detail with reference to the accompanying drawings. In a preferred aspect, a semiconductor storage device of the disclosure is a NAND type or an NOR type flash memory formed by stacking a memory chip of a main side and one or more memory chips of a slave side. However, the semiconductor storage device of the disclosure may also include a memory chip or other memory chips of different types, e.g., a dynamic random access memory (DRAM), rather than the flash memory. Further, the flash memory may also be equipped with a serial interface function capable of inputting and outputting data in synchronization with a clock signal.

Figure 1:
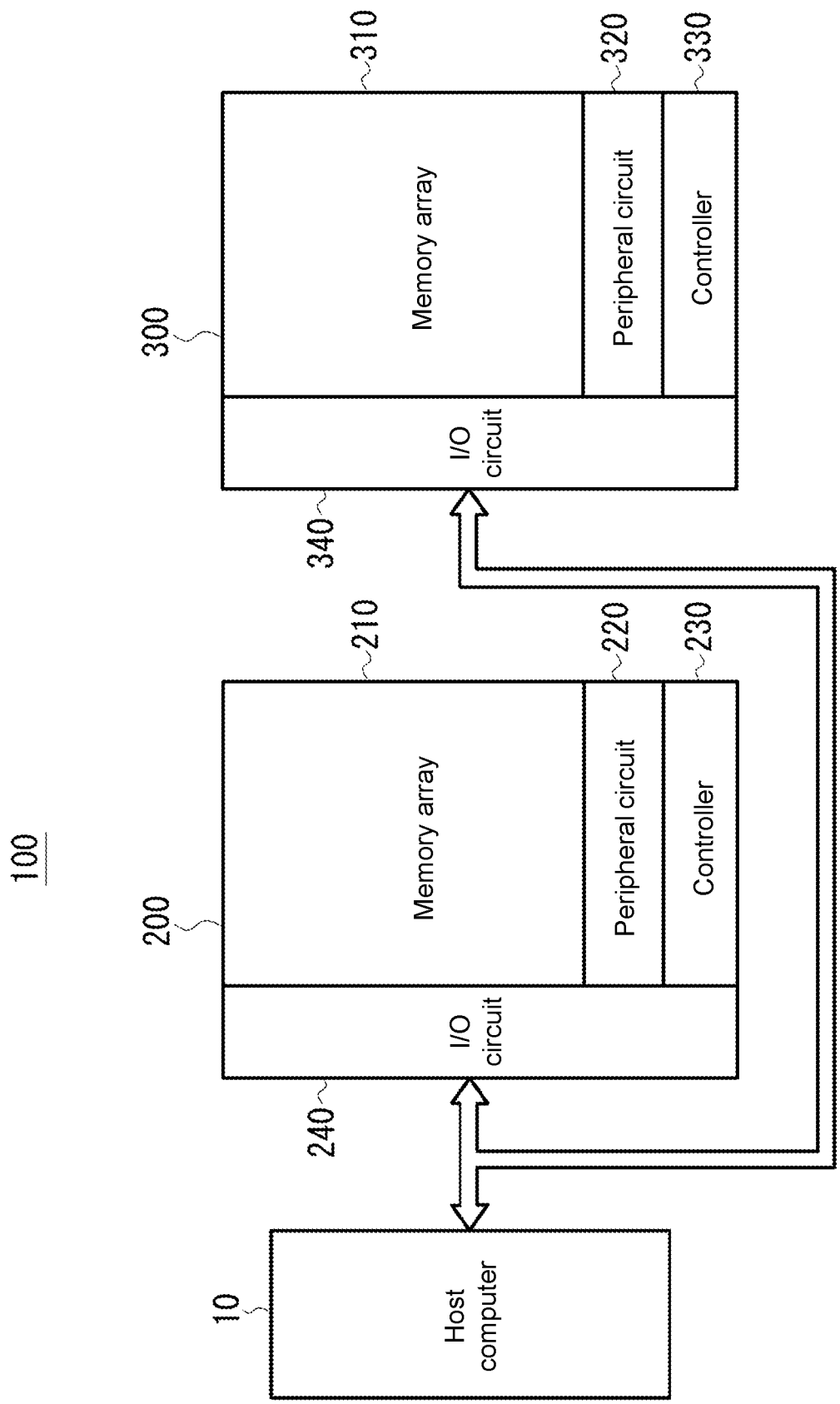
FIG. 1 is a schematic view showing a monolithic stacked flash memory device according to an embodiment of the disclosure.

FIG. 1 is a schematic view showing a monolithic stacked flash memory device according to an embodiment of the disclosure. A flash memory device 100 includes a memory chip 200 on a master side (i.e., a master chip) and at least one memory chip 300 on slave side (i.e., a slave chip). In the present embodiment, one slave chip 300 is illustrated, however the flash memory device 100 may also include two or more slave chips. The flash memory device 100 includes, for example, a ball grid array (BGA) package or a chip level package (CSP) package. For example, in the BGA package, a stacked master chip and a slave flip chip are mounted onto a flexible circuit substrate, or are connected to a circuit substrate through wire-bonding.

The master chip 200 includes a memory array 210 including a plurality of NAND string units, a peripheral circuit 220 including a decoder or a page buffer/sense circuit for selecting a row or a column of the memory array, a controller controlling an overall operation of the master chip 200, an input/output (I/O) circuit 240 forming an external interface for signal transmission and reception with a host computer 10 via an external terminal. The slave chip 300 is configured in the same way as the master chip 200 and thus, includes a memory array 310 including a plurality of NAND string units; a peripheral circuit 320 including a decoder or a page buffer/sensing circuit for selecting a row or a column of the memory array, a controller 330 controlling an overall operation of the slave chip 300, an I/O circuit 340 forming an external interface for signal transmission and reception with the host computer 10 via the external terminal. Moreover, the external terminal of the flash memory device 100 can be shared by the master chip 200 and the slave chip 300.

Each of the I/O circuit 240 of the master chip 200 and the I/O circuit 340 of the slave chip 300 may include, for example, an external terminal for data registration output, an external terminal for inputting a control signal (e.g., an address latch enable, a command latch enable and so on), an external terminal for outputting a busy signal/a ready signal, a terminal for inputting a clock signal, and so on. However, the flash memory device equipped with an SPI function operates with compatibility with an NOR type flash memory. Therefore, it should be noted that an input terminal for inputting data, an output terminal for outputting data, a clock terminal for inputting a clock signal, a chip selection terminal, a write-protect terminal and the like may be included, but the terminal for outputting the busy signal or the ready signal may not have to be provided.

The master chip 200 and the slave chip 300 are connected to the host computer 10 via the I/O circuit 240 and the I/O circuit 340, the host computer 10 issues to the flash memory device 100 a read command to read, program, erase, and read contents of a status register (SR), a write command to perform a writing operation on the SR, and a WP command to lock the SR or a one-time programming area and so on. The master chip 200 and the slave chip 300 monitor the address input from the host computer 10 via the I/O circuit 240 and the I/O circuit 340 and determine whether or not they are selected. The master chip 200 or the slave chip 300 performs an instruction given by the host computer 10 when it is selected. However, in a condition that a write command for writing the SR is received, each of the master chip 200 and the slave chip 300 executes a write command and writes the same contents to respective SRs thereof. Additionally, when the WP command is received, the master chip 200 and the slave chip 300 also respectively execute the WP command and perform a lock operation on the SR/the one-time programming area. Moreover, in a condition that a read command of the SR is received, a selected memory chip reads and outputs the contents of the SR.

Figure 2:
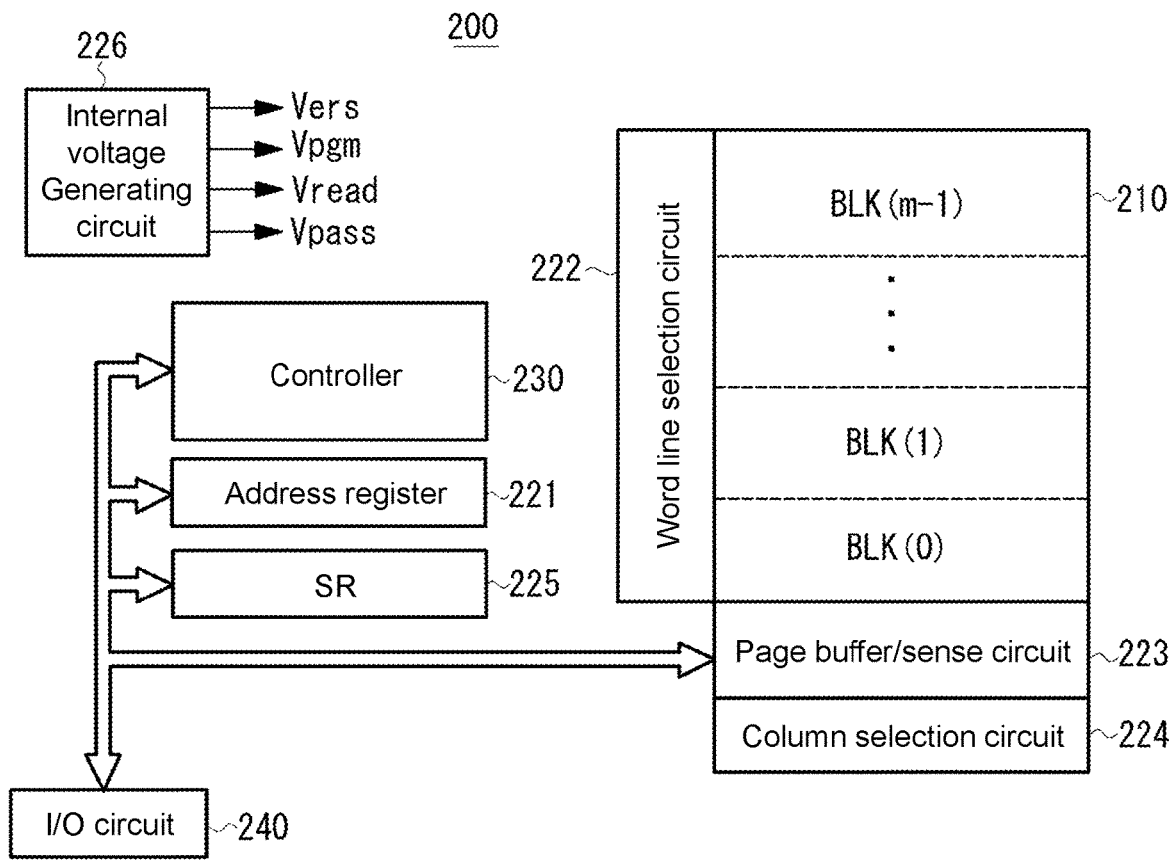
FIG. 2 is a schematic block diagram showing a structure of a memory chip of a master side according to an embodiment of the disclosure.

FIG. 2 is a diagram showing the internal configuration of the master chip according to an embodiment of the disclosure. The master chip 200 includes the memory array 210, in which a plurality of memory units are arranged in an array, the peripheral circuit 220, the controller 230 and the I/O circuit 240. In addition, since the slave chip 300 is configured in the same way as the master chip 200, only the internal configuration of the master chip 200 will be described.

The peripheral circuit 220 includes an address register 221 receiving address data via the I/O circuit 240, a word line selection circuit 222 selecting a block and a word line based on row address information Ax from the address register 221, a page buffer/sense circuit 223 maintaining data read from the page selected by the word line selection circuit 222 or maintaining input data to be programmed by the selected page, a column selection circuit 224 selecting data of a column address in the page buffer/sense circuit 223 based on column address information Ay from the address register 221, an SR 225 storing protection information set by the user regarding the operation and specifications of the flash memory or information related to whether or not the flash memory is in a busy state and an internal voltage generating circuit 226 generating various voltages (including a write voltage Vpgm, a pass voltage Vpass, a read voltage Vread and an erase voltage Vers) required for reading, program and erasing data. The controller 230 receives a command from the I/O circuit 240 to control the operation of the master chip 200.

The memory array 210 has m memory blocks BLK(0), BLK(1), . . . and BLK(m-1) in a column direction. A plurality of NAND string units formed by connecting a plurality of memory units in series are formed in a storage block. The memory array further includes a redundant area or a one-time programming area that is not accessible by the user.

During a reading operation of the memory array 210, a positive voltage is applied to a bit line, a voltage of, for example, 0 V is applied to a selected word line, a pass voltage is applied to an unselected word line, and a voltage of 0 V is applied to a common source line. During a programming operation, a program voltage Vpgm at a high level is applied to the selected word line, an intermediate-level voltage is applied to the unselected word line, and a voltage at a level corresponding to data of "0" or "1" is supplied to a bit line GBL. During an erasing operation, a voltage of 0 V is applied to the selected word line in the block, a high-level voltage is applied to a P well, and electrons of a floating gate are extracted to a substrate, thereby erasing the data in units of blocks.

The host computer 10 outputs a command or an address to the flash memory device 100 when instructing the flash memory device 100 to perform a desired action. The controller 230 (or the controller 330) determines whether or not it is selected based on the address from the host computer 10 and executes the command from the host computer 10 if determining as being selected. However, it is an exceptional condition that the command from the host computer 10 is a write command to write the SR or a WP command of the SR. When the controller 230 (or the controller 330) receives these commands, the write command or the WP command in executed in the chip themselves regardless of the address. In the presence of the read of the SR, the selected memory chip outputs the contents of the SR.

Figure 3:
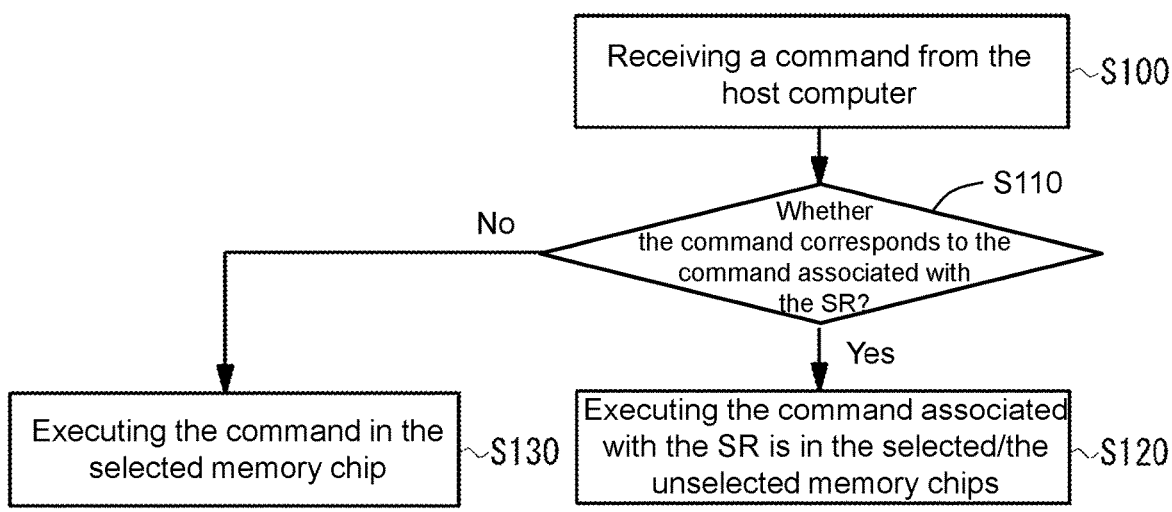
FIG. 3 is a flowchart showing the operation of a command associated with a status register (SR) in a monolithic stack according to an embodiment of the disclosure.

FIG. 3 shows a flow of the operation of the command associated with the SR. If the controller 230 (or the controller 330) receives a command from the host computer 10 (S100), it is determined whether the command corresponds to the write command or the WP command associated with the SR (S110). If the command is associated with the SR, the command associated with the SR is executed in the selected memory chip and the unselected memory chip, respectively (S120). If it is any other command, the command is executed in the selected memory chip (S130).

Figure 4:
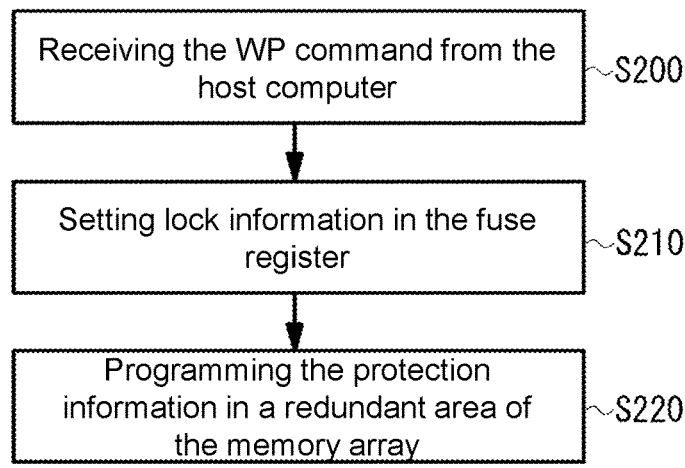
FIG. 4 is a flowchart showing a basic operation when the WP command is executed according to an embodiment of the disclosure.

Next, FIG. 4 shows a flow of the operation of the WP command. When receiving the WP command (S200), the controller 230 (or the controller 330) executes the WP command and sets lock information for locking the SR/the one-time programming area in the fuse register (S210). For example, a bit corresponding to the fuse register assigned to the SR/the one-time programming area is set "1". If the bit serves for the lock information and is set to "1" in the fuse register, the access to the SR or the one-time programming area by a subsequent write command is inhibited.

In addition, the controller 230 (or the controller 330), in a condition of executing the WP command, further programs the protection information written in the SR and the lock information program set in the fuse register in a predetermined redundant area of the memory array (S220). The aforementioned operation is a normal programming operation for selecting a page of the memory array. The SR or the fuse register is volatile, and when the flash memory is powered off, the data stored in these registers is erased. When the flash memory is again powered on, the controller 230 (or the controller 330) reads the protection information and the lock information from the redundant area of the memory array and loads the read protection information and lock information into the SR and the fuse register.

The control of the programming operation of the protection information and the lock information when the WP command is executed according to a first embodiment of the disclosure will be described below. For descriptive convenience, the selected memory chip is set as a master chip, and the unselected memory chip is set as a slave chip.

In the first embodiment, when the WP command is executed in the master chip and the slave chip, it is ensured that a busy period of the master chip is longer than a busy period of the slave chip. Specifically, the controller 230 (or the controller 330) controls the programming operation so that a programming time Tm in which the protection information and the lock information are programmed in the master chip is longer than a programming time Ts in which the protection information and the lock information are programmed in the slave chip (where Tm>Ts).

Regarding the programming, a programming pulse is usually applied by means of incremental step pulse program (ISPP), and a next programming pulse is applied according whether programming verification is passed or failed. However, in the present embodiment, a programming pulse number Nm applied to the master chip is fixed, a programming pulse number Ns applied to the slave chip is fixed, and the programming pulse number Nm is set to be greater than the programming pulse number Ns. In addition, the verification of the bit in which the protection information and the lock information are programmed is set to be always failed. In addition, the program voltage and the time of the pulse application are adjusted so that the protection information and the lock information are programmed in one programming pulse or programming pulses whose number less than Nm/Ns, and the verification is set to be failed. On the other hand, when a programming pulse is subsequently applied, a selected bit line may also be set to data of "1" which indicates programming inhibit. In this way, the programming of the master chip is forcibly terminated at the programming pulse number Nm, and the programming of the slave chip is forcibly terminated at the programming pulse number Ns. The control information related to the programming pulse number Nm, the programming pulse number Ns, or the verification operation may serve as trimming information to be set to the redundant area of the memory array in advance, or may be adaptively set and changed by the user. The controller 230 (or the controller 330), when executing the WP command, controls the programming based on the control information.

Thus, in a condition that the master chip and the slave chip simultaneously execute the WP command, the programming is controlled in a manner that the programming time of the master chip is always longer than the programming time of the slave chip, or in a manner that the programming time of the slave chip is always shorter than the programming time of the master chip. Thereby, when the master chip outputs contents of the SR in response to the read command from the host computer, an unfavorable condition that the slave chip is in the busy state, while the master chip is not in the busy state (in the ready state) may be prevented. In other words, when the master chip outputs the ready state, the slave chip is always in the ready state.

Figure 5:
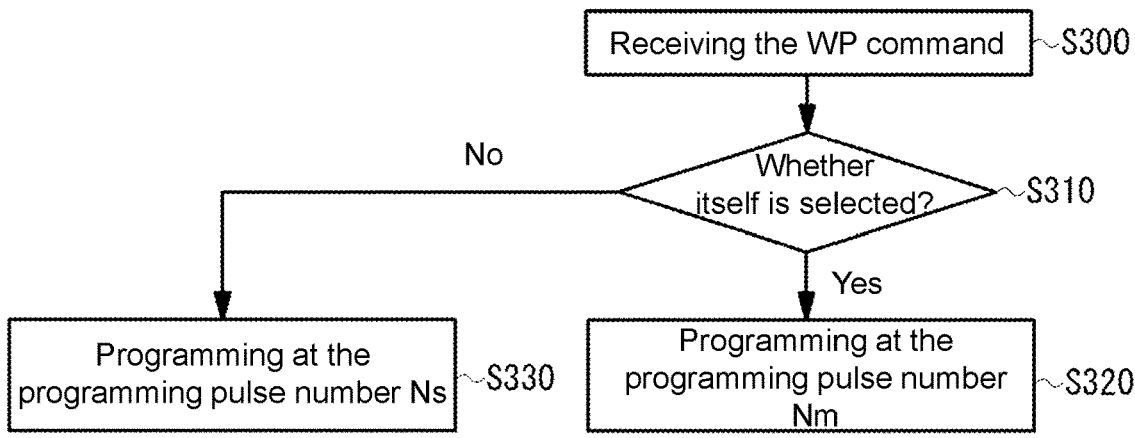
FIG. 5 is a flowchart showing the control of a programming operation when WP command is executed according to a first embodiment of the disclosure.

FIG. 5 shows a flow of the programming operation of the first embodiment. When the host computer 10 issues the WP command (S300), the controller 230 (or the controller 330) determines whether it is the selected memory chip (S310). In a condition that it is the selected one, the controller 230 (or the controller 330) programs the protection information and the lock information program to the redundant area of the memory array at the programming pulse number Nm (S320) and if not, programs the protection information and the lock information program to the redundant area in the memory array at the programming pulse number Ns (S330).

Figure 6:
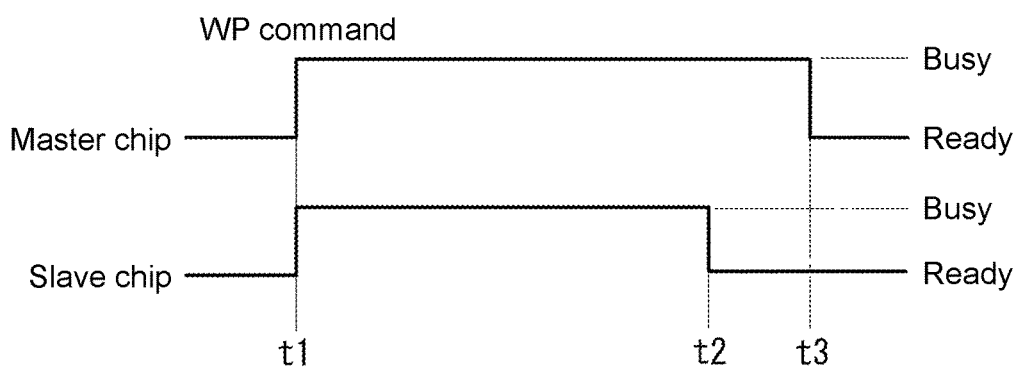
FIG. 6 is a timing chart showing state transitions of the master chip and the slave chip when the WP command is executed according to the first embodiment of the disclosure.

FIG. 6 shows the busy state transitions of the master chip and the slave chip of the present embodiment. At a time t1, if the WP command is input, the master chip and the slave chip execute the WP command, and the master chip and the slave chip become in the busy state. Then, the slave chip terminates the programming of the lock information and protection information at a time t2 and terminates the busy state. The master chip terminates the programming of the lock information and protection information at a time t3 which is delayed from the time t2 and terminates the busy state. In this way, the busy state of the slave chip certainly ends earlier than the busy state of the master chip.

In the flash memory equipped with the SPI function, an external terminal for outputting the busy signal/ready signal is not required, and the busy state may be monitored by reading the SR. However, if the flash memory has an external terminal for outputting the busy signal/ready signal, the busy information may be output to the host computer via the external terminal.

Then, a second embodiment of the disclosure will be described. In the first embodiment, since the master chip and the slave chip simultaneously execute the WP command, current consumption of the protection information and the lock information program is doubled. In the second embodiment of the disclosure, to avoid the doubled current consumption, the master chip and the slave chip are made to execute the programming operation at different times, and thus, a waiting time of the programming operation is introduced.

In the second embodiment of the disclosure, an internal counter is configured in each memory chip, one of the memory chips uses the counter to count a waiting time until the programming operation of the other memory chip ends and starts the programming operation after the programming operation of the other memory chip ends. In addition, during the programming operation of the other memory chip, the one of the memory chips uses the counter to count the waiting time to keep being in the busy state.

For example, it is assumed that the master chip first performs the programming operation. First, if receiving the WP command, the master chip immediately starts the programming operation. On the other hand, the slave chip waits to start the programming operation until the master chip becomes in a ready state. In this case, a waiting time tWAIT of the slave chip is set to be greater than a programming time tPGM of the master chip, so as to set a count value of the slave chip (where tWAIT>tPGM).

Then, when the master chip terminates the programming operation, the slave chip starts the programming operation. During the programming operation of the slave chip, the master chip keeps being in the busy state. In this case, the count value of the master chip is set in a manner that the waiting time tWAIT of the master chip is greater than the programming time tPGM of the slave chip (i.e. tWAIT>tPGM).

Figure 7:
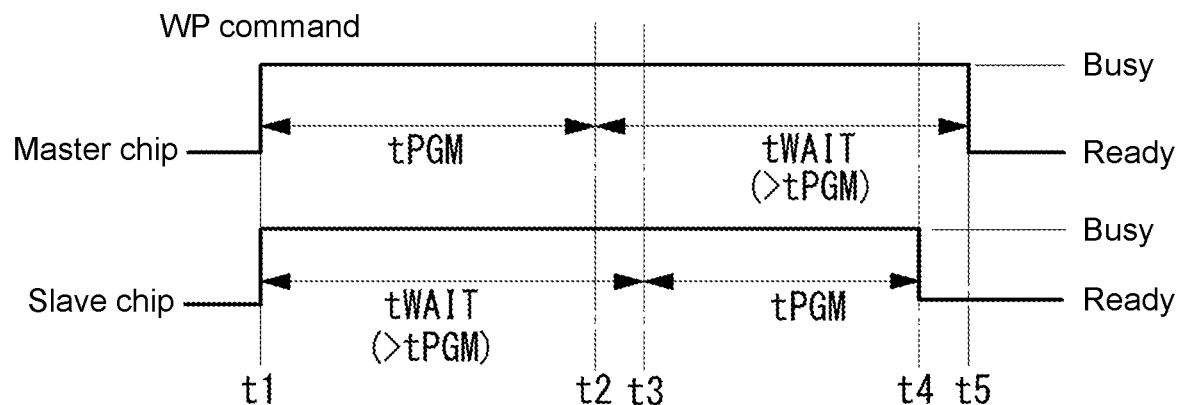
FIG. 7 is a timing chart showing state transitions of the master chip and the slave chip when WP command is executed according to a second embodiment of the disclosure.

FIG. 7 shows the busy state transitions of the master chip and the slave chip of the present embodiment. When the WP command is input from the host computer at the time t1, the master chip executes the WP command, i.e., programs the protection information and the lock information program to the redundant area of the memory array. In this case, a programming pulse number Nm1 of the master chip is fixed to a predetermined number, and being similar to the first embodiment, after the programming pulse number Nm1 is applied the master chip forcibly terminates the programming operation. Therefore, the programming time tPGM in the master chip is constant.

On the other hand, the slave chip does not execute the WP command at the time t1 and enters a waiting state according to the count value set in the counter. In this case, a waiting time tWAIT of the slave chip is set to be longer than the programming time tPGM required by the master chip.

Then, the master chip terminates the programming operation at the time t2, while the slave chip is still in the waiting time. The master chip, once terminating the programming operation, enters the waiting state according to the time set in the counter and keeps being in the busy state during this period.

At the time t3 after a certain period from the time t2, the slave chip starts the programming operation right after the waiting time ends. In this case, the programming pulse number Ns1 of the slave chip is fixed to a predetermined number, and being similar to the first embodiment, the slave chip forcibly terminates the programming operation when the programming pulse number Ns1 is applied. Therefore, the programming time tPGM in the slave chip is fixed. In addition, the waiting time tWAIT of the master chip is set to be longer than the programming time tPGM of the slave chip.

At a time t4, the slave chip terminates the programming operation, and at a time t5 after a certain period from the time t4, the waiting time of the master chip ends, and the busy state of the master chip ends. Thereby, the busy state of the slave chip certainly ends before the end of the busy state of the master chip, so as to prevent the unfavorable condition that the busy state of the slave chip does not end when the busy state of the master chip ends.

Additionally, in a condition that an allowable time tALLOW of the programming operation is determined, the programming time tPGM may be set by means of setting a sum of the programming time tPGM of the master chip and the programming time tPGM of the slave chip to be less than the allowable time tALLOW. For example, when the allowable time tALLOW is 700 μs, and an application time of a programming pulse is 50 μs, in the consideration of a discontinuity time between the time t2 at which the master chip terminates the programming operation and the time t3 at which the slave chip starts the programming operation, the programming pulse number Nm1 of the master chip may be set to six times or less (i.e., tPGM=300 μs), and the programming pulse number Ns 1 of the slave chip may be set to six times or less (i.e., tPGM=300 μs).

Subsequently, a third embodiment of the disclosure will be described. When the host computer 10 issues the read command of the SR, the contents of the SR of the master chip (i.e., the selected memory chip) are output to the host computer. Thus, in the third embodiment, when issuing the WP command, the slave chip is first instructed to execute the WP command, and then the master chip is instructed to execute the WP command.

Figure 8:
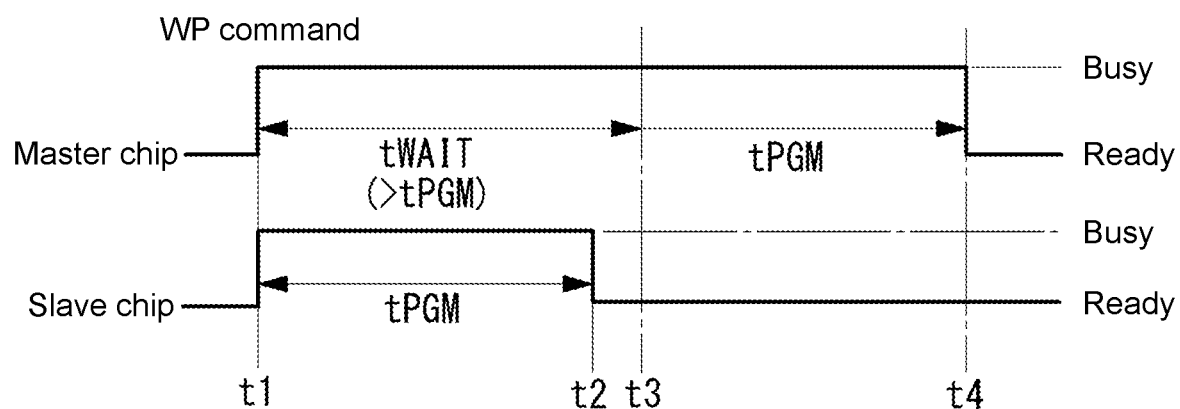
FIG. 8 is a timing chart showing state transitions of the master chip and the slave chip when WP command is executed according to a third embodiment of the disclosure.

FIG. 8 shows the busy state transitions of the master chip and the slave chip of the third embodiment. When the WP command is input from the host computer at the time t1, the slave chip executes the WP command, that is, programs the protection information and the lock information program to the redundant area of the memory array. In this case, the programming pulse number Ns2 of the slave chip is fixed to a predetermined number, and being similar to the first embodiment, the slave chip forcibly terminates the programming operation when the programming pulse number Ns2 is applied. Therefore, the programming time tPGM in the slave chip is constant.

On the other hand, the master chip does not execute the WP command at the time t1 and enters the waiting state according to the count value set in the counter. In this case, the waiting time tWAIT of the master chip is set to be longer than the programming time tPGM of the slave chip.

At the time t2, the slave chip terminates the programming operation. After that, at the time t3, the master chip starts the programming operation right after the waiting time ends and terminates the programming operation at the time t4. It should be noted here that the programming pulse number of the master chip is not fixed, and the verification is not forcibly set to be failed, but is performed in the same manner as in the normal programming operation. That is, at the time in which the verification of the protection information and the lock information is passed, the programming operations ends. Thereby, the time required for executing the WP command may be shorter than that required in the second embodiment. In addition, it is to be mentioned that in the third embodiment, since only the master chip implements the waiting time, the internal counter is no longer required in the slave chip.

Although both the master chip and the slave chip are described as NAND type flash memories in the above embodiments, the disclosure may also be applied to NOR type master and slave chips. Moreover, although the preferred embodiments of the disclosure have been described in detail above, the disclosure is not limited thereto, and various modifications and changes thereof can be made by those with ordinary skills in the art without departing from the scope of the disclosure.

What is claimed is:

1. A semiconductor storage device, comprising a plurality of memory chips and selecting any one of the memory chips based on an address provided from the external, each of the memory chips comprising:
   a status register (SR), capable of storing protection information;
   a non-volatile memory array;
   a write portion, performing a writing operation on the SR in response to a command from the external;
   a read portion, performing a reading operation on the SR in response to a command from the external;
   a write inhibit portion, inhibiting the writing operation on the SR in response to a command from the external and programming the protection information and write inhibit information in a specific area of the memory array;
   a control portion, controlling operations of the memory chip, wherein
   the control portion of the selected memory chip controls the programming in a manner that a programming time of the write inhibit portion is longer than a programming time of the write inhibit portion of an unselected memory chip.

2. The semiconductor storage device as recited in claim 1, wherein
the control portion of the unselected memory chip controls the programming in a manner that the programming time of the write inhibit portion is shorter than the programming time of the write inhibit portion of the selected memory chip.

3. The semiconductor storage device as recited in claim 2, wherein
the programming is controlled in a manner that a programming pulse number of the selected memory chip is greater than a programming pulse number of the unselected memory chip.

4. The semiconductor storage device as recited in claim 2, wherein
the unselected memory chip is programmed after the selected memory chip is programmed, and during the programming of the unselected memory chip, a waiting time is controlled in a manner that a busy state continues in the selected memory chip.

5. The semiconductor storage device as recited in claim 2, wherein
the selected memory chip is programmed after the unselected memory chip is programmed, and during the programming of the unselected memory chip, the selected memory chip is controlled in a manner that waiting for the start of the programming.

6. The semiconductor storage device as recited in claim 2, wherein
the read portion of the selected memory chip outputs a busy state contained in contents of the SR.

7. The semiconductor storage device as recited in claim 2, wherein
the control portion determines whether the memory chip itself is the selected memory chip based on the address from the external, and the selected memory chip performs an operation in response to the command from the external.

8. The semiconductor storage device as recited in claim 2, wherein
the control portion determines whether the command from the external is a command associated with the SR, and when it is a command associated with the SR, the selected memory chip and the unselected memory chip perform operations in response to the command associated with the SR.

9. The semiconductor storage device as recited in claim 2, wherein
the plurality of memory chips are flash memories.

10. The semiconductor storage device as recited in claim 2, wherein
the plurality of memory chips are provided with a serial interface function capable of inputting and outputting data in synchronization with a clock signal provided from the external.

11. The semiconductor storage device as recited in claim 1, wherein
the programming is controlled in a manner that a programming pulse number of the selected memory chip is greater than a programming pulse number of the unselected memory chip.

12. The semiconductor storage device as recited in claim 1, wherein
the unselected memory chip is programmed after the selected memory chip is programmed, and during the programming of the unselected memory chip, a waiting time is controlled in a manner that a busy state continues in the selected memory chip.

13. The semiconductor storage device as recited in claim 1, wherein
the selected memory chip is programmed after the unselected memory chip is programmed, and during the programming of the unselected memory chip, the selected memory chip is controlled in a manner that waiting for the start of the programming.

14. The semiconductor storage device as recited in claim 1, wherein
the read portion of the selected memory chip outputs a busy state contained in contents of the SR.

15. The semiconductor storage device as recited in claim 1, wherein
the control portion determines whether the memory chip itself is the selected memory chip based on the address from the external, and the selected memory chip performs an operation in response to the command from the external.

16. The semiconductor storage device as recited in claim 1, wherein
the control portion determines whether the command from the external is a command associated with the SR, and when it is a command associated with the SR, the selected memory chip and the unselected memory chip perform operations in response to the command associated with the SR.

17. The semiconductor storage device as recited in claim 1, wherein
the plurality of memory chips are flash memories.

18. The semiconductor storage device as recited in claim 1, wherein
the plurality of memory chips are provided with a serial interface function capable of inputting and outputting data in synchronization with a clock signal provided from the external.

* * * * *